United States Patent
Wong

(10) Patent No.: US 8,233,520 B2
(45) Date of Patent: Jul. 31, 2012

(54) RADIO FREQUENCY SIGNAL TRANSCEIVER AND COMMUNICATION SYSTEM EMPLOYING THE SAME

(75) Inventor: Kwo-Jyr Wong, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 642 days.

(21) Appl. No.: 12/408,728

(22) Filed: Mar. 23, 2009

(65) Prior Publication Data

US 2009/0285270 A1  Nov. 19, 2009

(30) Foreign Application Priority Data

May 16, 2008  (TW) .................................. 97118010 A

(51) Int. Cl.
*H04B 1/38* (2006.01)
(52) U.S. Cl. ...................... 375/219; 375/221; 455/114.3
(58) Field of Classification Search .................. 375/219, 375/221; 455/114.3, 126
See application file for complete search history.

(56) References Cited

U.S. PATENT DOCUMENTS

| 5,585,953 | A | 12/1996 | Zavrel |
| 6,987,954 | B2 | 1/2006 | Nielsen |
| 7,529,524 | B1 * | 5/2009 | Giallorenzi et al. .......... 455/126 |
| 7,983,327 | B2 * | 7/2011 | Brobston ...................... 375/219 |
| 2004/0151257 | A1 | 8/2004 | Staszewski et al. |
| 2005/0119025 | A1 | 6/2005 | Mohindra et al. |
| 2006/0270367 | A1 | 11/2006 | Burgener et al. |

* cited by examiner

*Primary Examiner* — Shuwang Liu
*Assistant Examiner* — Ross Varndell
(74) *Attorney, Agent, or Firm* — Altis Law Group, Inc.

(57) ABSTRACT

A radio frequency (RF) signal communication system provided with amplifier predistortion comprises an antenna for wireless communication. Through the antenna and a receiving path of the system, RF signals are received and transmitted to a baseband module. The transmission path of the system comprises a predistorter and an amplifier, in which the predistorter performs predistortion to compensate signal distortion under the amplification by the amplifier. A coupler is utilized to sample a portion of RF signals output by the amplifier as the feedbacks for the predistortion.

20 Claims, 5 Drawing Sheets

RADIO FREQUENCY SIGNAL TRANSCEIVER AND COMMUNICATION SYSTEM EMPLOYING THE SAME

BACKGROUND

1. Technical Field

The invention relates to wireless communication techniques, and in particular, to a radio frequency (RF) transceiver with a signal predistortion function.

2. Description of Related Art

Wireless communication devices, such as base stations and repeaters in wireless local area networks (WLANs) or cellular networks, utilize power amplifiers to amplify radio frequency (RF) signals. Signal amplification may induce non-linear distortions in amplified signals. Such non-linearity may be ameliorated by digital signal predistortion before the amplification of RF signals.

In one example, a cable that connects a power amplifier to an antenna, such as an antenna installed outdoors connected with an indoor transceiver, may still suffer significant power loss in the cable even if the signals have been preprocessed by a method of predistortion and amplification. Such an arrangement for connecting power amplifiers and antennas, however, is commonly utilized by current communication systems for convenience of equipment management and maintenance. For example, a traditional wireless communication base station typically has power amplifiers and a digital predistorter placed indoors and utilizes a cable to carry amplified RF signals to an outdoor antenna. This induces more RF signal power loss in the cable.

DETAILED DESCRIPTION OF THE EMBODIMENTS

Figure 1:
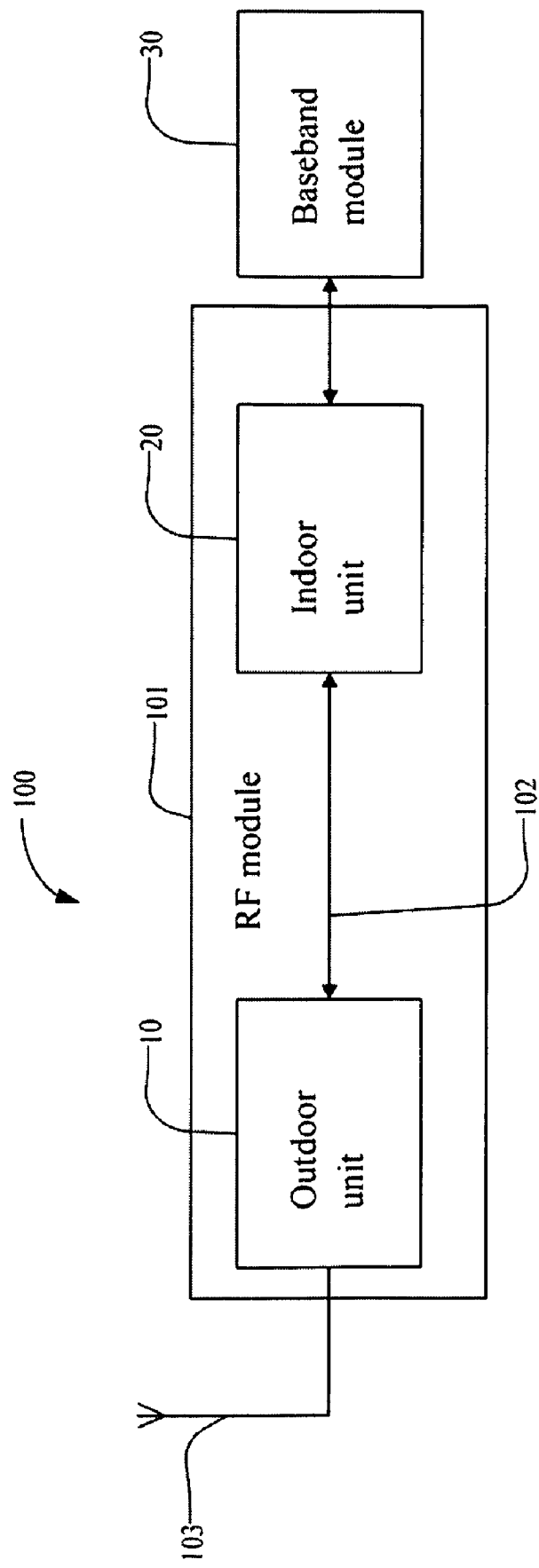
FIG. 1 is a schematic view of the configuration of a wireless communication system.

With reference to FIG. 1, a wireless communication system 100 is a radio frequency (RF) signal transceiving device, such as a wireless communication base station or a repeater. The base station or the repeater may be configured for wireless local area networks (WLAN) conforming to the Institute of Electrical and Electronics Engineers (IEEE) 802.11 or 802.16 standards, or cellular networks. The wireless communication system 100 comprises an RF module 101 and a baseband module 30. The baseband module 30 is configured for processing baseband signals. The RF module 101 up converts baseband signals received from the baseband module 30 to intermediate frequency signals, and subsequently RF signals, and down converts RF signals received from a wireless communication channel to intermediate frequency signals and subsequently to baseband signals.

Figure 2:
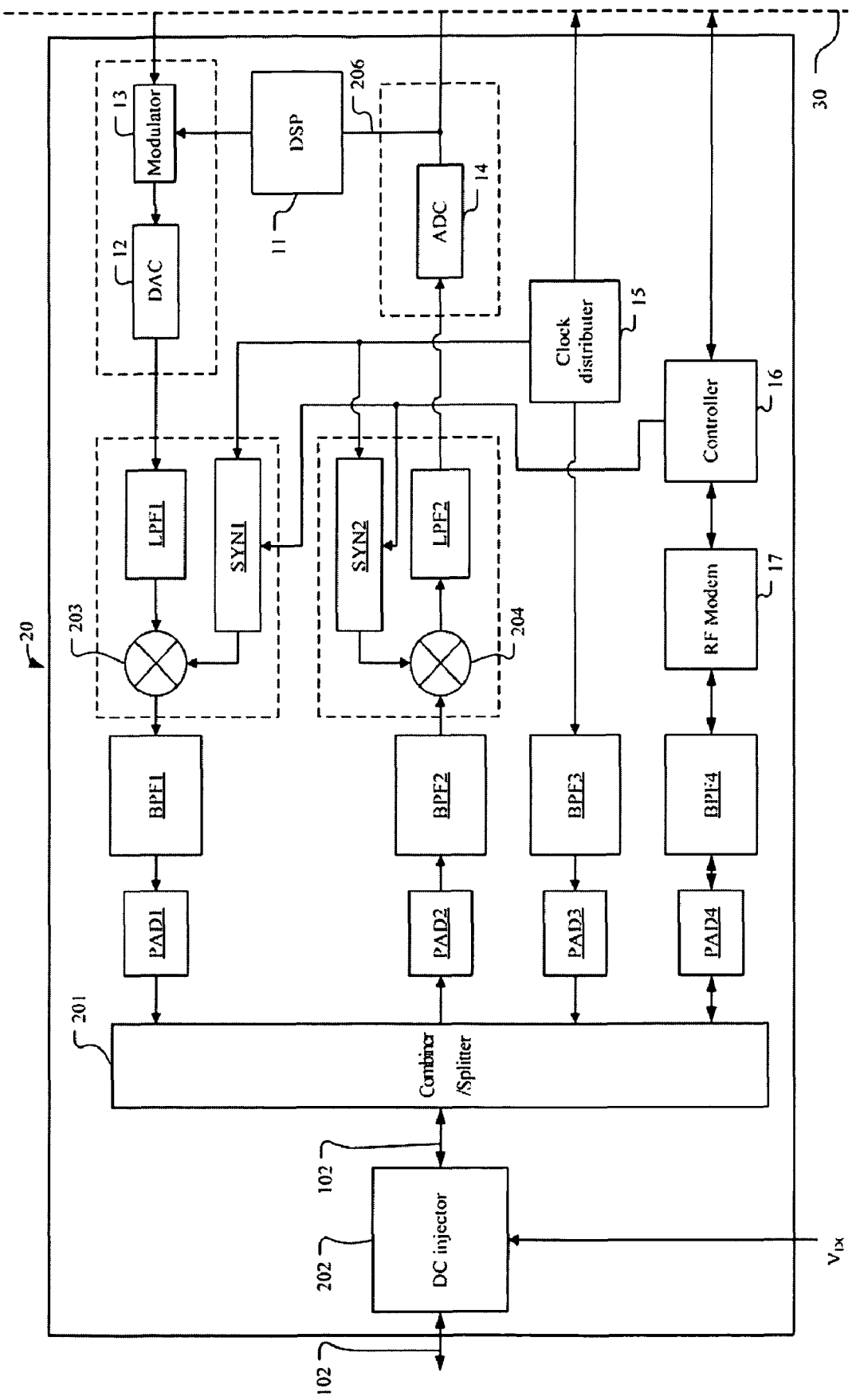
FIG. 2 is a schematic view of the configuration of an indoor unit of a wireless communication system.
Figure 3:
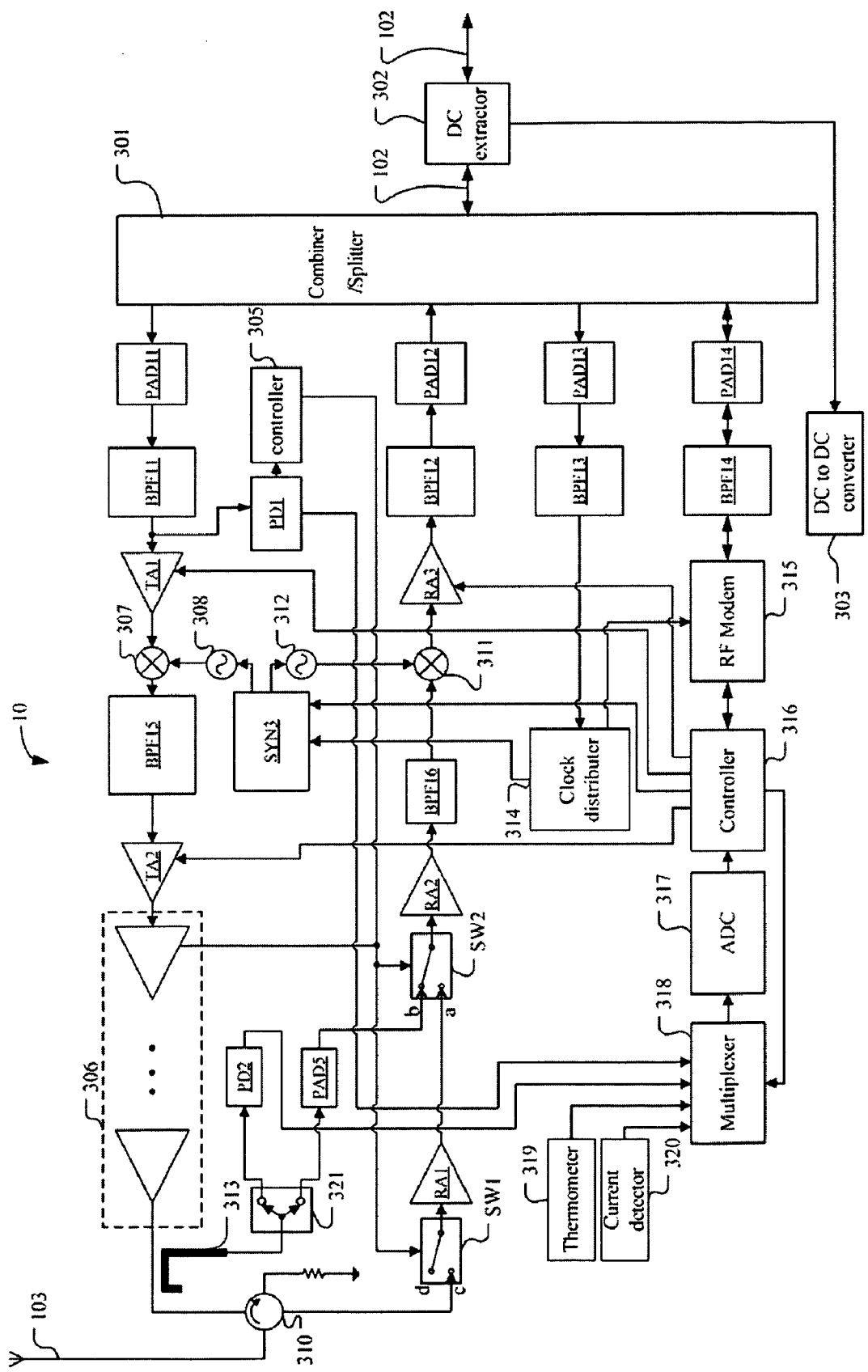
FIG. 3 is a schematic view of the configuration of an outdoor unit of a wireless communication system.

The RF module 101 further comprises an outdoor unit 10 and an indoor unit 20. An exemplary arrangement of the RF module 101 may be that the outdoor unit 10 is located outdoors, and the indoor unit 20 is located indoors, thus physically isolating the outdoor unit 10 from the indoor unit 20. A communication channel 102 connects the outdoor unit 10 to the indoor unit 20. The communication channel 102 preferably comprises a single cable connecting the outdoor unit 10 to the indoor unit 20. Note that the communication channel 102 between the outdoor unit 10 and the indoor unit 20 may comprise one or more cables, optical fibers, or other transmission media. The indoor unit 20 processes and modulates baseband signals. The outdoor unit 10 receives signals from the indoor unit 20, amplifies the received signals and transmits the amplified signals through the antenna 103, and receives RF signals from the antenna 103, amplifies and transmits the received RF signals through communication channel 102 to the indoor unit 20. The baseband module 30 and the indoor unit 20 can be integrated as one device or configured as two separated devices. FIGS. 2 and 3 respectively show embodiments of the indoor unit 20 and the outdoor unit 10.

Figure 4:
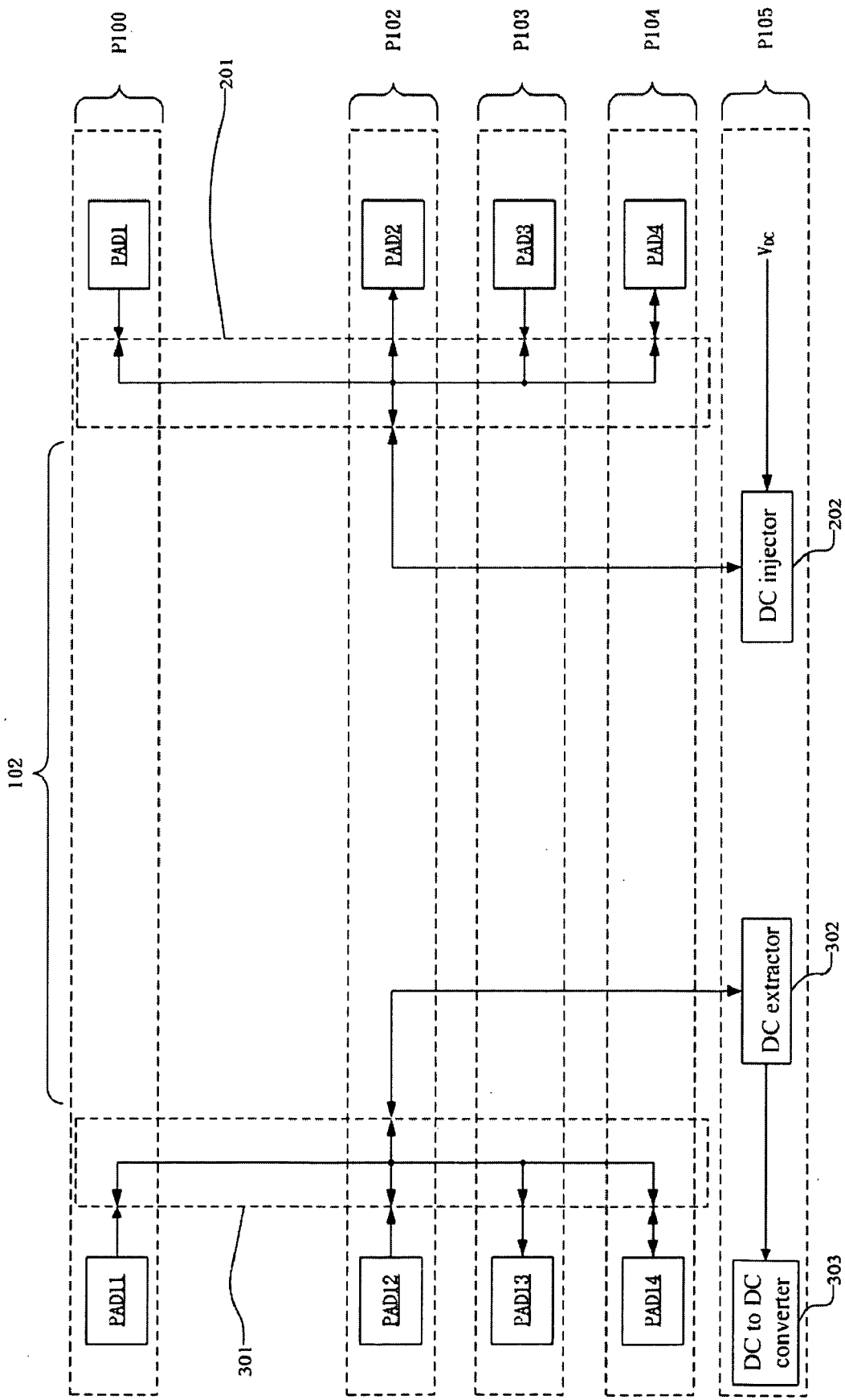
FIG. 4 is a schematic view of a communication channel between indoor and outdoor units of a wireless communication system.

The communication channel 102 may comprise a plurality of communication subchannels for respectively conveying to-be-transmitted signals (referred to as outgoing signals in the following), received signals (referred to as incoming signals in the following), clock signals, control signals, and electrical power signals between the outdoor unit 10 and the indoor unit 20. With reference to FIG. 4, the communication channel 102 comprises communication subchannels P100, P102, P103, P104, and P105. For example, the communication subchannels P100, P102, P103, and P104 respectively comprise frequency bands around 400 MHz, 300 MHz, 10 MHz, and 200 MHz respectively, but are not limited thereto. The communication subchannel P100 conveys outgoing signals from an attenuator pad PAD1 to an attenuator pad PAD11. The communication subchannel P102 conveys incoming signals from an attenuator pad PAD12 to an attenuator pad PAD2. The communication subchannel P103 conveys clock signals between an attenuator pad PAD3 and an attenuator pad PAD13. The communication subchannel P104 conveys control signals between an attenuator pad PAD4 and an attenuator pad PAD14. The communication subchannel P105 conveys direct current (DC) power from the indoor unit 20 to the outdoor unit 10. Signal paths for conveying those signals in the wireless communication system 100 are detailed in the following.

Clock Signal Transmission Path:

With reference to FIG. 2, a clock distributor 15 provides clock signals to a plurality of components in the indoor unit 20, such as synthesizers SYN1 and SYN2, and provides clock signals to a plurality of components in the outdoor unit 10 through a band pass filter BPF3, the attenuator pad PAD3, a combiner/splitter 201, and the communication channel 102. The clock distributor 15 comprises a buffer for insulating clock signals input to the clock distributor 15 from clock signals output by the clock distributor 15.

With reference to FIG. 3, the clock distributor 15 provides the clock signals to a clock distributor 314 through the communication channel 102, a combiner/splitter 301, an attenuator pad PAD13, and a band pass filter BPF13. The clock distributor 314 accordingly distributes the clock signals to a plurality of components in the outdoor unit 10, such as a synthesizer SYN3 and an RF modem 315. The clock distributor 314 comprises a buffer for insulating clock signals input to the clock distributor 314 from clock signals output by the clock distributor 314.

Control Signal Transmission Path:

A controller 16 in FIG. 2 coordinates and controls components in the indoor unit 20, such as the synthesizers SYN1 and SYN2. A controller 316 in FIG. 3 coordinates and controls components in the outdoor unit 10, such as the synthesizer SYN3 and amplifiers TA1, TA2, and RA3. The controllers 16 and 316 respectively utilize an RF modem 17 and an RF modem 315 to convert control signals into analog signals and send the analog signals to each other through band pass filters BPF4 and BPF14, the attenuator pads PAD4 and PAD14, the combiners/splitters 201 and 301, and the communication channel 102. The RF modems 17 and 315 perform modulation and demodulation of control signals. A multiplexer 318 receives various signals from a plurality of system components connected to the multiplexer 318, such as receiving temperature representative signals from a thermometer 319, electrical current representative signals from a current detector 320, and other signals from a band pass filter BPF11, a power detector PD1, a coupler 313, and a power detector PD2.

The thermometer 319 detects a temperature of the outdoor unit 10 and outputs corresponding temperature representative signals. The current detector 320 detects electrical current of an amplifier 306 and outputs corresponding current representative signals. The controller 316 can be notified of overheating of the outdoor unit 10 or current abnormalities of the amplifier 306 based on the detection and accordingly triggers protection measures. The power detector PD1 detects signals on the signal transmission path, such as intermediate frequency (IF) signals between the band pass filter BPF11 and the amplifier TA1, and outputs the detected result to the multiplexer 318 and a switch controller 305. The power detector PD2 detects and outputs signals sampled by the coupler 313 to the multiplexer 318. The coupler 313 couples signals transmitted by the amplifier 306 as sampled or extracted feedback signals for digital signal predistortion. The coupler 313 may couple or sample signals transmitted by the amplifier 306 by electromagnetically reacting to magnetic field changes caused by the output signals of the power amplifier 306. Alternatively, the coupler 313 may receive signals transmitted by the antenna 103 as extracted feedback signals for digital signal predistortion. The multiplexer 318 receives signals from a plurality of sources and selectively outputs signals received from one of the plurality of sources under the control of the controller 316. The signals output from the multiplexer 318 are converted into digital format by the analog-to-digital converter 317 and are subsequently input to the controller 316. The controller 316 controls respective components such as the amplifiers TA1, TA2, RA2, and SYN3.

Data Signal Transmission Path:

With reference to FIG. 2, the modulator 13 receives digital signals from the baseband module 30, performs digital signal predistortion on the digital signals against distortion which may be caused during amplification by amplifiers of the wireless communication system 100, and modulates the digital signals. A digital signal processor (DSP) 11 receives feedback signals and controls the modulator 13 based on the received feedback signals. Feedback signals input to the DSP 11 are generated from coupling of output signals of the amplifier 306 by the coupler 313. The DSP 11 and the modulator 13 may collaboratively act as a predistortion unit. A digital-to-analog converter (DAC) 12 receives and further processes the modulated digital signals to generate analog signals. The synthesizer SYN1 generates periodic signals utilizing clock signals from the clock distributor 15. After the analog signals are filtered by a low pass filter LPF1, a mixer 203 mixes the filtered signal with the periodic signals and generates mixed signals. The mixed signals travel through a band pass filter BPF1 and an attenuator pad PAD1 to the combiner/splitter 201, and are combined by the combiner/splitter 201 with signals from the PAD3 and PAD4 to be transmitted to the outdoor unit 10 through the communication channel 102. Direct current (DC) voltage signal $V_{DC}$ is provided to the communication channel 102 through a DC signal injector 202 and transmitted to the outdoor unit 10 through the communication channel 102.

Figure 5:
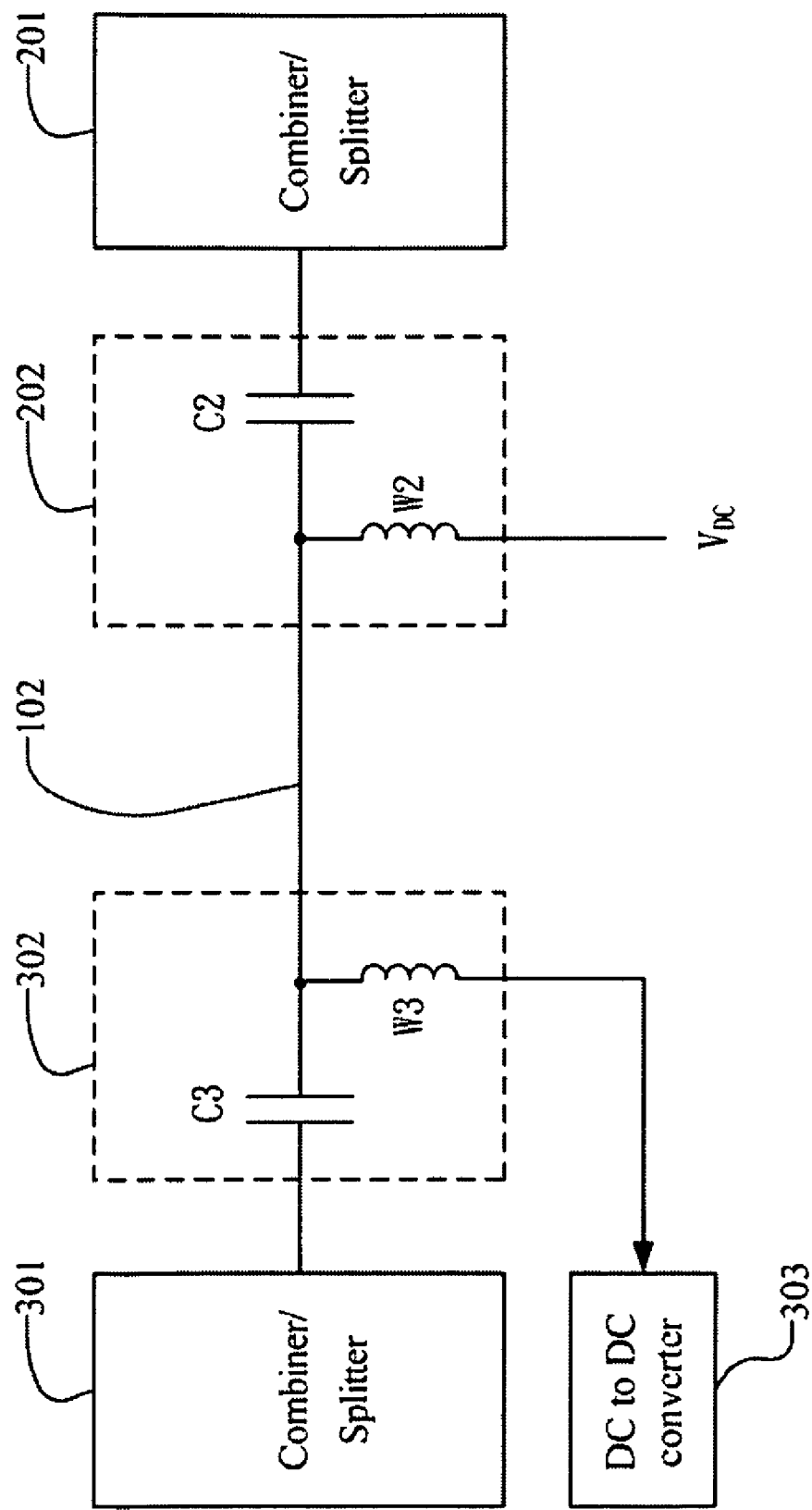
FIG. 5 is a schematic view of a direct current (DC) injector and a DC extractor of a wireless communication system.

With reference to FIG. 3, a DC signal extractor 302 extracts DC power signals from the communication channel 102 to a DC to DC converter 303. The DC to DC converter 303 provides DC power signals to respective components of the outdoor unit 10. Thus, the indoor unit 20 sends required electrical power to the outdoor unit 10 through the communication channel 102. FIG. 5 shows a DC injector 202 and an exemplary DC extractor 302. The DC injector 202 may comprise a capacitor C2 connected with an inductor W2 in parallel. The DC extractor 302 may comprise a capacitor C3 connected with an inductor W3 in parallel.

The combined signals are conveyed in the communication channel 102 and through the combiner/splitter 301 to attenuator pads PAD11, PAD13, and PAD14, and subsequently to band pass filters BPF11, BPF13, and BPF14. The outgoing signals, after being filtered by the band pass filter BPF11, are transmitted to the amplifier TA1 and a power detector PD1. The power detector PD1 detects whether signal power between any appropriate point along the signal transmission path between the band pass filter BPF11 and the amplifier TA1 is greater than a predetermined value, and alerts the switch controller 305 by sending a corresponding signal thereto. The switch controller 305 controls switches SW1 and SW2 and the power amplifier 306 based on the signal sent by the power detector PD1. The control workflow of the switch controller 305 is detailed in the following.

The amplifier TA1 amplifies the filtered signals and sends the amplified signals to a mixer 307. The mixer 307 mixes the amplified signals received from the amplifier TA1 with signals from an oscillator 308, and sends the mixed signals to a band pass filter BPF 15 for filtering. After the mixed signals are filtered by the band pass filter BPF 15, the filtered signals are amplified by amplifiers TA2 and 306, and sent through a circulator 310 and the antenna 103 to a wireless communication channel.

The band pass filter BPF11 filters IF signals to obtain, for example, 20-400 MHz signals. The band pass filter BPF15 filters RF signals to obtain, for example, 800-3500 MHz signals. The amplifiers TA1 and TA2 work with different signal frequencies, and are utilized to contribute different gains.

Signal Receiving Path:

Signals received from a wireless communication channel through the antenna 103 and a circulator 310 are sent to the switch SW1, an amplifier RA1, a terminal 'a' of the switch SW2, the amplifier RA2, and a band pass filter BPF16. Signals filtered by the band pass filter BPF16 are then sent to a mixer 311 to be mixed with signals from an oscillator 312. The signals, after being mixed by the mixer 311, are orderly processed by and sent through an amplifier RA3, a band pass filter BPF12, and a attenuator pad PAD12 to the combiner/splitter 301, and through the communication channel 102 to the indoor 20.

With reference to FIG. 2, the signals from the attenuator pad PAD12 are sent through the communication channel 102 to the combiner/splitter 201, and subsequently to an attenuator pad PAD2, filtered by a band pass filter BPF2, sent to and mixed by a mixer 204 with signals provided by the synthesizer SYN2. The synthesizer SYN2 utilizes clock signals provided by the clock distributor 15 to generate periodic signals. The mixed signals after being filtered by the low pass filter LPF2 are sent to and converted by an analog-to-digital converter 14 into digital signals, and subsequently sent to the baseband module 30. A bus 206 connects the analog-to-digital converter 14 and the DSP 11. RF signals to be transmitted by the antenna 103 of the wireless communication system 100 can be sampled and returned through the bus 206 to the DSP 11, where the DSP 11 coordinates digital signal predistortion at the modulator 13 based on the returned signals from the bus 206.

The switch SW2 can connect the output terminal thereof to the terminal 'a' or terminal 'b', thus to selectively output signals received by the antenna 103 or signals coupled by the coupler 313 to the amplifier RA2. Signals received by the antenna 103 are sent through the circulator 310, the switch SW1, the amplifier RA1 to the terminal 'a'. Signals coupled by the coupler 313 from RF signals transmitted by the amplifier 306 are sent through a slitter 321 and an attenuator pad PAD5 to the terminal 'b' of the switch SW2. Since the wireless communication system 100 cannot simultaneously transmit and receive signals, the switch controller 305 controls switches SW1 and SW2 based on signals provided from the power detector PD1 such that signals coupled by the coupler 313 can be conveyed by the signal receiving path to the DSP 11 during RF signal transmission by the wireless communication system 100. The DSP 11 controls digital signal predistortion at the modulator 13 based on the coupled signals. Signals received by the antenna 103 can be conveyed by the signal receiving path to the baseband module 30 during RF signal reception by the wireless communication system 100, and the switch controller 305 can accordingly turn off the amplifier 306.

When the power detector PD1 detects that the signal power along the signal transmission path is greater than a predetermined value, implying that the wireless communication system 100 is transmitting signals, the switch controller 305 controls the switches SW1 and SW2 to connect the signal receiving path to the coupler 313. Specifically, the switch SW1 is accordingly switched to the position of a terminal d, and the switch SW2 the position of the terminal 'b'. When the power detector PD1 detects signal power on the signal transmission path is not greater than the predetermined value, implying that the wireless communication system 100 is receiving signals, the switch controller 305 controls the switches SW1 and SW2 to connect the signal receiving path to the antenna 103. Specifically, the switch SW1 is accordingly switched to the position of a terminal c, and the switch SW2 the position of the terminal 'a'.

The wireless communication system 100 system facilitates antenna-received and coupler-sampled RF signals to share identical components on the signal receiving path at different times, eliminating the need of a dedicated return path for feedback signals of digital signal predistortion.

The switch controller 305 may alternatively be integrated to the controller 316. The number of amplifiers in the wireless communication system 100 may also be adjusted.

In conclusion, the wireless communication system 100 comprises signal transmission and receiving paths for respectively transmitting signals from the baseband module 30 to the antenna 103 and receiving signals from the antenna 103 to the baseband module 30. The wireless communication system 100 comprises a controller for controlling switches to couple the signal receiving path to the coupler 313 or the antenna 103. When the signal receiving path is coupled to the coupler 313, the DSP 11 coordinates digital signal predistortion based on signals sampled by the coupler 313. The system 100 utilizes components on the signal receiving path more effectively and does not need a dedicated return path for feedback signals of digital signal predistortion.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:
1. A radio frequency (RF) signal transceiver coupled with a baseband module, comprising:
an antenna that transceives RF signals through a wireless communication channel;
a signal receiving path through which the RF signals received by the antenna are directed to the baseband module;
a signal transmission path through which digital signals from the baseband module are directed to the antenna to be delivered by the antenna, wherein the signal transmission path comprises:
a modulator that receives and modulates the digital signals from the baseband module;
a digital-to-analog converter that receives and processes the modulated digital signals to generate analog signals;
a first mixer assembly comprising a first mixer stage and a second mixer stage, wherein the first mixer stage is operable to generate first mixed signals conveyable in a first frequency band to the second mixer stage from the analog signals, and the second mixer stage is operable to generate second mixed signals from the first mixed signals; and
an amplifier that receives and amplifies the second mixed signals to generate amplified analog signals for transmission by the antenna;
wherein the transceiver further comprises:
a coupler that samples a portion of the amplified analog signals;
a switch coupled to the signal receiving path;
a controller configured for controlling the switch to selectively couple the signal receiving path to the coupler or the antenna; and
a processor that controls the modulator to perform signal predistortion based on the signal portion sampled by the coupler while the signal receiving path is coupled to the coupler;
wherein the signal receiving path comprises a second mixer assembly that comprises a third mixer stage and a fourth mixer stage, wherein the third mixer stage is operable to generate third mixed signal conveyable in a second frequency band to the fourth mixer stage from the RF signals received by the antenna or the signal portion sampled by the coupler, the second frequency band is different from the first frequency band, and the fourth mixer stage is operable to generate fourth mixed signals to the baseband module from the third mixed signals;
wherein the transceiver comprises a first module and a second module physically isolated from the first module, the first module comprising the modulator, the digital-to-analog converter and the first mixer stage and the fourth mixer stage, wherein the second module comprises the amplifier and the second mixer stage and the third mixer stage, and wherein the modulator performs the signal predistortion to compensate for signal distortions caused by the amplification by the amplifier.

2. The transceiver as described in claim 1, wherein the first module is connected to the second module through a single cable, wherein the single cable comprises a first communication subchannel operable to carrying the first mixed signal in the first frequency band and a second communication subchannel operable to carrying third mixed signals in the second frequency band separated from the first frequency band.

3. The transceiver as described in claim 2, wherein the amplifier comprising a power amplifier and communication channels for conveying communications and electrical power between the first and second modules is integrated in the single cable.

4. The transceiver as described in claim 2, wherein the RF signals received by the antenna are sent by the second module through the cable to the first module and further to the baseband module, the receiving path further comprises two or more amplifiers, and the RF signals received by the antenna and the signal portion sampled by the coupler respectively undergo different times of amplification by different number of amplifiers in the receiving path in response to the controlling of the switch.

5. The transceiver as described in claim 4, wherein the first module comprises the processor, and the signal portion sampled by the coupler is sent to the processor through the single cable.

6. The transceiver as described in claim 5, wherein the first module sends electrical power to the second module through the single cable to support operation of the second module.

7. The transceiver as described in claim 1, wherein the controller detects signals along the signal transmission path and responds to detected signals along the signal transmission path by controlling the switch to couple the signal receiving path to the coupler.

8. The transceiver as described in claim 7, wherein the controller responds to detected power levels of data signals on the signal transmission path, and accordingly controls the switch to couple the signal receiving path to the antenna.

9. A radio frequency (RF) communication system, comprising:
an antenna that transceives RF signals through a wireless communication channel;
a signal receiving path through which the RF signals received by the antenna are directed to a baseband module;
a signal transmission path through which digital signals from the baseband module are directed to the antenna to be delivered by the antenna, wherein the signal transmission path comprises:
a modulator that receives and modulates the digital signals from the baseband module;
a digital-to-analog converter that receives and processes the modulated digital signals to generate analog signals;
a first mixer assembly comprising a first mixer stage and a second mixer stage, wherein the first mixer stage is operable to generate first mixed signals conveyable in a first frequency band to the second mixer stage from the analog signals, and the second mixer stage is operable to generate second mixed signals from the first mixed signals; and
an amplifier that receives and amplifies the second mixed signals to generate amplified analog signals for transmission by the antenna;
wherein the transceiver further comprises:
a coupler that samples a portion of the signals amplified and output by the amplifier;
a switch coupled to the signal receiving path;
a controller configured for controlling the switch to selectively couple the signal receiving path to the coupler or the antenna; and
a processor that controls the modulator to perform signal predistortion based on the signals portion sampled by the coupler while the signal receiving path is coupled to the coupler;
wherein the signal receiving path comprises a second mixer assembly that comprises a third mixer stage and a fourth mixer stage, wherein the third mixer stage is operable to generate third mixed signal conveyable in a second frequency band to the fourth mixer stage from the RF signals received by the antenna or the signal portion sampled by the coupler, the second frequency band is different from the first frequency band, and the fourth mixer stage is operable to generate fourth mixed signals to the baseband module from the third mixed signals;
wherein the transceiver comprises a first module and a second module physically isolated from the first module, the first module comprising the modulator, the digital-to-analog converter and the first mixer stage and the fourth mixer stage, wherein the second module comprises the amplifier and the second mixer stage and the third mixer stage, and wherein the modulator performs the signal predistortion to compensate for signal distortions caused by the amplification by the amplifier.

10. The system as described in claim 9, wherein the first module is connected to the second module by a single cable, wherein the single cable comprises a first communication subchannel operable to carry the first mixed signal in the first frequency band and a second communication subchannel operable to carry the third mixed signals in the second frequency band separated from the first frequency band.

11. The system as described in claim 10, wherein the amplifier comprising a power amplifier and communication channels for conveying communications and electrical power between the first and second modules is integrated in the single cable.

12. The system as described in claim 10, wherein the RF signals received by the antenna are sent by the second module through the single cable to the first module and further to the baseband module, the receiving path further comprises two or more amplifiers, and the RF signals received by the antenna and the signal portions sampled by the coupler respectively undergo different times of amplification by different number of amplifiers in the receiving path in response to the controlling of the switch.

13. The system as described in claim 12, wherein the first module comprises the processor, and signal portions sampled by the coupler are sent to the processor through the single cable.

14. The system as described in claim 13, wherein the first module sends electrical power to the second module through the cable to support operation of the second module.

15. The system as described in claim 9, wherein the controller detects signals along the signal transmission path and, in response to the detected signals on the signal transmission path, controls the switch to couple the signal receiving path to the coupler.

16. The system as described in claim 15, wherein the controller, in response to detected power levels of data signals on the signal transmission path, controls the switch to connect the signal receiving path to the antenna.

17. The system as described in claim 9, wherein the communication system comprises a wireless communication base station or a repeater.

18. A radio frequency (RF) signal communication system comprising:
- an antenna that sends or receives RF signals through a wireless communication channel;
- a signal receiving path through which the RF signals received by the antenna are directed to a baseband module;
- a signal transmission path through which digital signals from the baseband module are directed to the antenna to be delivered by the antenna, wherein the signal transmission path comprises:
- a predistortion unit that performs a method of signal predistortion on signals along the signal transmission path; and
- an amplifier that receives and amplifies the post-predistortion signals to generate amplified analog signals for transmission by the antenna;
- wherein the transceiver further comprises:
- a coupler that samples a portion of the signals amplified and output by the amplifier;
- a switch coupled to the signal receiving path; and
- a controller configured for detecting power levels of signals on the signal transmission path and controlling the switch to selectively couple the signal receiving path to the coupler or the antenna based on the detecting such that incoming signals in the signal receiving bath comprise signals derived from the received RF signals or the signal portions sampled by the coupler;
- wherein the predistortion unit receives and utilizes the signal portions sampled by the coupler from the signal receiving path to perform the signal predistortion;
- wherein the transmission path comprises two mixer stages operable to sequentially perform signal mixing of the post-predistortion signals such that the post-predistortion signals between the two mixer stages are conveyable in a first frequency band, one of the mixer stages in the transmission path is integrated with the predistortion unit as a first module, and the other is integrated with the amplifier as a second module; and
- the receiving path comprises two mixer stages operable to sequentially perform signal mixing of the incoming signals such that the incoming signals between the two mixer stages in the receiving path are conveyable in a second frequency band, one of the mixer stages in the receiving path is integrated with the coupler in the first module, and the other is integrated with the predistortion unit in the second module, the second frequency band is separated from the first frequency band.

19. The system as described in claim 18, wherein the predistortion unit further comprises:
- a modulator that receives and modulates the digital signals from the baseband module; and
- a processor that controls the modulator to perform the signal predistortion based on the signals sampled by the coupler while the signal receiving path is coupled to the coupler.

20. The system as described in claim 19, further comprising:
- a first module comprising the predistortion unit for performing the signal predistortion to compensate for signal distortions caused by the amplification by the amplifier; and
- a second module coupled to the first module through a single cable, and comprising the amplifier, wherein the post-predistortion signals are sent to the amplifier through the single cable.

* * * * *